(12) United States Patent
Tsuruoka et al.

(10) Patent No.: US 9,419,023 B2
(45) Date of Patent: Aug. 16, 2016

(54) DISPLAY DEVICE

(71) Applicant: Japan Display Inc., Tokyo (JP)

(72) Inventors: Kazuto Tsuruoka, Tokyo (JP); Norio Oku, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/574,706

(22) Filed: Dec. 18, 2014

(65) Prior Publication Data

US 2015/0187807 A1    Jul. 2, 2015

(30) Foreign Application Priority Data

Dec. 26, 2013  (JP) ................................ 2013-269928

(51) Int. Cl.
| | |
|---|---|
| *H01L 29/04* | (2006.01) |
| *H01L 27/12* | (2006.01) |
| *G02F 1/1345* | (2006.01) |
| *G09F 9/30* | (2006.01) |

(52) U.S. Cl.
CPC ............ *H01L 27/124* (2013.01); *G02F 1/1345* (2013.01); *G09F 9/30* (2013.01); *H01L 27/1248* (2013.01); *G02F 2201/42* (2013.01)

(58) Field of Classification Search
CPC . H01L 51/56; H01L 51/5275; H01L 51/5012; H05K 1/09; H05K 1/181
USPC ......................... 257/72, 59, E29.273
See application file for complete search history.

(56) References Cited

U.S. PATENT DOCUMENTS

| | | | | |
|---|---|---|---|---|
| 5,905,548 | A * | 5/1999 | Shimada | ................. H01L 27/12 257/E27.111 |
| 2012/0138940 | A1* | 6/2012 | Sato | .................... H01L 27/1218 257/59 |
| 2012/0140424 | A1* | 6/2012 | Sato | ........................ G02F 1/167 361/749 |

FOREIGN PATENT DOCUMENTS

JP            2010-8677 A     1/2010

* cited by examiner

*Primary Examiner* — Andy Huynh
(74) *Attorney, Agent, or Firm* — Typha IP LLC

(57) ABSTRACT

A display device includes a first substrate arranged with a plurality of pixels on a first surface, the plurality of pixels having a display element including a transistor, and a first wiring connected to the transistor, a through electrode arranged in a first contact hole reaching the first wiring from a second surface facing the first surface of the first substrate, a second wiring connected with the through electrode, a first insulation film arranged covering the second wiring on the second surface of the first substrate, and a terminal connected with a second wiring via a second contact hole arranged in the first insulation film.

11 Claims, 14 Drawing Sheets

DISPLAY DEVICE

CROSS REFERENCE TO RELATED APPLICATIONS

This application is based upon and claims the benefit of priority from the prior Japanese Patent Application No. 2013-269928, filed on Dec. 26, 2013, the entire contents of which are incorporated herein by reference.

FIELD

The present invention is related to a structure of an input terminal of a display device.

BACKGROUND

In recent years, the progress of display devices which controls the display gradation of each pixel using a thin film transistor (TFT) such as liquid display devices or organic EL (organic electroluminescence) display devices is developing. This type of display device is arranged with a terminal part connected to external circuits etc. from the need to supply a current to each of a plurality of pixels arranged with a thin film transistor. This terminal part includes a structure in which a plurality of terminals which receive a current are arranged. It is important that these display devices prevent degradation of the terminal part and improve the reliability of connections within the terminal part.

In this respect, in a conventional display device, an aperture part which exposes the surface of a terminal electrode connected with a thin film transistor is formed on the surface of a TFT substrate formed with a plurality of thin film transistors, and the terminal electrode conducts with the terminal of a wiring substrate arranged on the surface of the TFT substrate via the aperture part (for example, refer to patent document 1 [Japanese Laid Open Patent 2010-008677]).

However, in the case where of a arranging the structure of the display device described in the patent document 1 described above, moisture enters into the interior of the display device from an aperture part formed in a glass substrate, corrosion occurs in those sections connecting the terminal electrode and wiring substrate and there is danger of badly affecting the reliability of the display device.

SUMMARY

An organic EL display device related to one embodiment of the present invention includes a first substrate arranged with a plurality of pixels on a first surface, the plurality of pixels having a display element including a transistor, and a first wiring connected to the transistor, a through electrode arranged in a first contact hole reaching the first wiring from a second surface facing the first surface of the first substrate, a second wiring connected with the through electrode, a first insulation film arranged covering the second wiring on the second surface of the first substrate, and a terminal connected with a second wiring via a second contact hole arranged in the first insulation film.

The first substrate may also include a resin. In addition, the resin may also include polyimide.

The first contact hole and the second contact hole may also be mutually arranged apart in plain view.

A second insulation film may be arranged on the second surface of the first substrate, and the first contact hole may reach the first wiring passing through the second insulation film.

The first insulation film and second insulation film may include silicon nitride or silicon oxide, or may be stacked with films of silicon nitride and silicon oxide.

The second contact hole may be arranged further to the periphery edge side of the first substrate than the first contact hole.

A second substrate may be arranged facing the first substrate with the first surface of the first substrate sandwiched therebetween.

The terminal may be connected with a flexible printed circuit substrate. In addition, a driver IC may be connected to the terminal. Furthermore, the terminal may be formed from a conductive film including a metal oxide.

DESCRIPTION OF EMBODIMENTS

Figure 1:
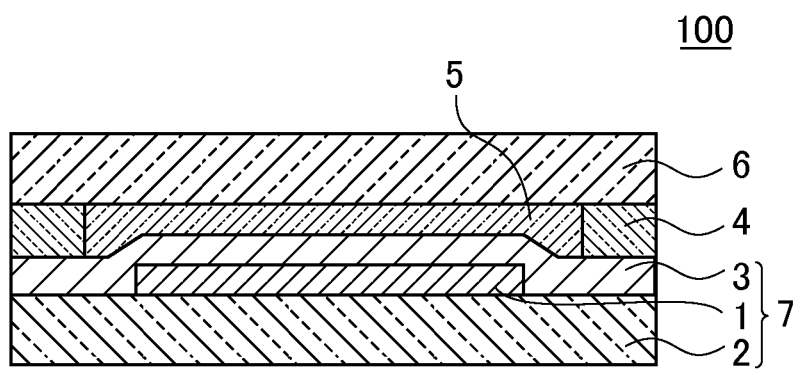
FIG. 1 is a vertical cross-sectional diagram showing an approximate structure of a display device related to one embodiment of the present invention.

The aim of the present invention is to solve the problems described above by preventing water from entering the interior of a display device from parts mounted on external circuits and provide a display device which can secure a high level of reliability. In addition, it is a goal of the present invention to provide a display device which can be mounted with an external circuit without adversely affecting mounting yield.

The embodiments of the display device of the present invention are explained below while referring to the drawings. Furthermore, the display device of the present invention can be realized by various modifications without being limited to the embodiment described below.

FIG. 1 shows an approximate structure of a display device 100 related to a first embodiment of the present invention. Furthermore, although an organic EL device arranged with an organic EL layer is given below as an example of the display device 100 related to one embodiment of the present invention, the display device 100 related to the present embodiment can also be applied to flat panel display devices such as self-emitting display devices, liquid crystal display device, or electronic paper type display device which have electrophoretic elements.

The display device 100 related to one embodiment of the present invention is formed by arranging a display element layer 1 which forms each pixel above a substrate 2 comprised from a resin such as polyimide as is shown in FIG. 1. Although a detailed depiction is omitted in FIG. 1, the display element layer 1 is formed by stacking in order from the side of the substrate 2, a TFT drive circuit layer, a reflection electrode, an organic EL layer, and a transparent electrode for example. The organic EL layer is formed for example by stacked an hole injection layer, a hole transport layer, a light emitting layer, an electron transport layer, and an electron injection layer.

Because the organic EL layer quickly degrades when exposed to the water component in the atmosphere, it is necessary to seal it from the exterior. As a result, the surface of the display element layer 1 arranged with an organic EL layer is covered for example by a transparent sealing film 3 comprised from a silicon nitride film formed by CVD and is also covered by a substrate 6 comprised from a resin such as polyimide etc. Below, a structure in which the display element layer 1 and sealing film 3 are formed above the substrate 2 is called [first substrate 7] and an opposing substrate 6 arranged facing the first substrate 7 is called [second substrate 6]. The second substrate 6 may include a color filter and may be arranged with a thin film device arranged with a touch panel function etch according to the specifications of the display device 100. In addition, by using a substrate comprised from a resin such as polyimide for each of the first substrate 7 and second substrate 6 respectively, the display device 100 may be provided with flexibility.

Furthermore, for the substrate 2 and substrate 6, a resin other than polyimide can be used if the resin can withstand a heating temperature used in the process for forming a TFT. In addition, in the case of transferring a TFT onto the substrate 2 and substrate 6, a plastic substrate or film substrate may be used for the substrate 2 and substrate 6.

As is shown in FIG. 1, in the display device 100, the surface of the display element layer 1 and surface of the second substrate 6 are parallel by maintaining a fixed distance of a gap between the first substrate 7 and second substrate 6. In addition, in order to prevent reflection or diffraction at the interface of the display element layer 1 or second substrate 6, for example a transparent resin 4, 5 such as an epoxy resin is filled. In addition, the gap between the first substrate 7 and second substrate 6 may be filled using a material other than the resin 4, 5 such as a known sealing material.

In this way, the flexible display device 100 is formed by bonding the first substrate 7 and second substrate 6 having flexibility. Below, the structure of the display device 100 related to the first to third embodiments of the present invention is explained in detail while referring to FIG. 2 to FIG. 9.

First Embodiment

Below, the structure and manufacturing process of the display device 100 related to the first embodiment of the present invention is explained while referring to FIG. 2 to FIG. 7. FIG. 2 to FIG. 7 are diagrams for explaining the manufacturing process of the display device 100 related to the first embodiment of the present invention.

Figure 2:
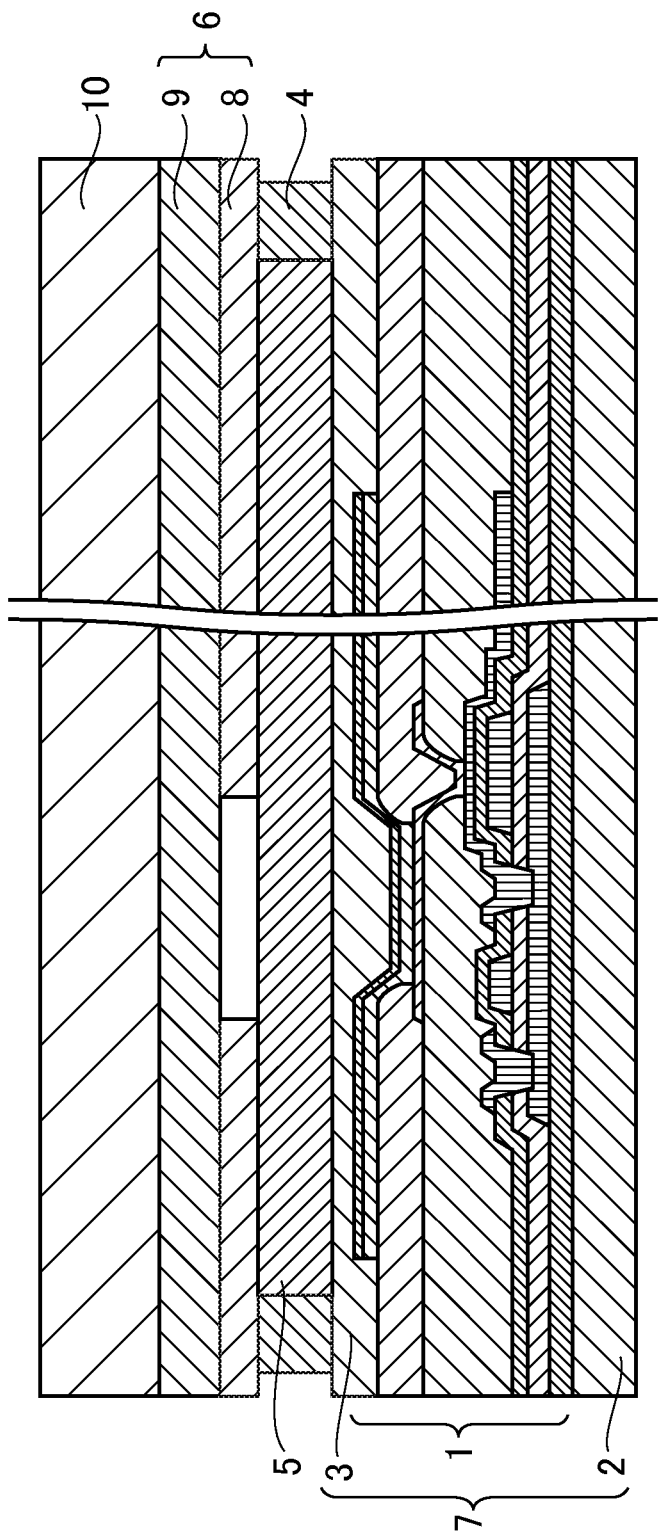
FIG. 2 is a cross-sectional diagram for explaining a manufacturing process of the display device related to the first embodiment of the present invention.

As is shown in FIG. 2, the display element layer 1 including a TFT drive circuit layer is formed above the substrate 2 comprised from a resin such as polyimide and is covered by a sealing film 3 thereby forming the first substrate 7. In addition, the second substrate 6 is formed by a layer 8 including a color filter to a substrate 9 comprised from a resin such as polyimide. Here, the substrates 2 and 9 comprised from a resin are formed to a thickness of about 10 um. Furthermore, although a structure in which only the second substrate 6 is formed above a manufacture purposed glass substrate 10 is shown in FIG. 2, the first substrate 7 is also formed above a manufacture purposed glass substrate 10. The glass substrate 10 is used as a support substrate for the first substrate 7 and second substrate 6 in the manufacturing process and the display device 100 is formed by finally peeling the glass substrate 10.

The first substrate 7 and second substrate 6 supported by this type of glass substrate 10 is bonded via resins 4 and 5. For example, the resin 4 with comparatively high viscosity before curing is formed in a frame shape using a dispenser etc. above the surface of the first substrate 7, and the resin 5 with comparatively low viscosity before curing is filled into the space enclosed by the resin 4. In this way, it is possible to continue present the resin 5 with a comparatively low viscosity from flowing outside the resin 4 and make the resin 5 spread evenly across the surface of the first substrate 7. From the difference of the functions of each of these resins 4 and 5, the resin 4 with a comparatively high viscosity before curing is referred to below as [Dam], and the resin 5 with a comparatively low viscosity is referred to as [Fill].

The first substrate 7 and second substrate 6 are bonded within a chamber under reduced pressure, the fill material 5 is pushed across the entire area of a space enclosed by the first substrate 7, second substrate 6 and dam material 4 and the dam material 4 and fill material 5 are cured and bonded under an atmosphere. In this way, as is shown in FIG. 2, the fill material 5 is formed covered by the entire display region.

Next, the glass substrate for manufacturing purposes bonded with the first substrate 7 is peeled using an existing method such as irradiating laser light for example. A UV laser may be used as the laser light. Furthermore, in the structure shown in FIG. 2 to FIG. 9, although the first substrate 7 is shown with a cross-sectional structure which becomes a lower side, each manufacturing process is performed with the glass substrate 10 formed with the second substrate 6 is arranged on the lower side.

Figure 3:
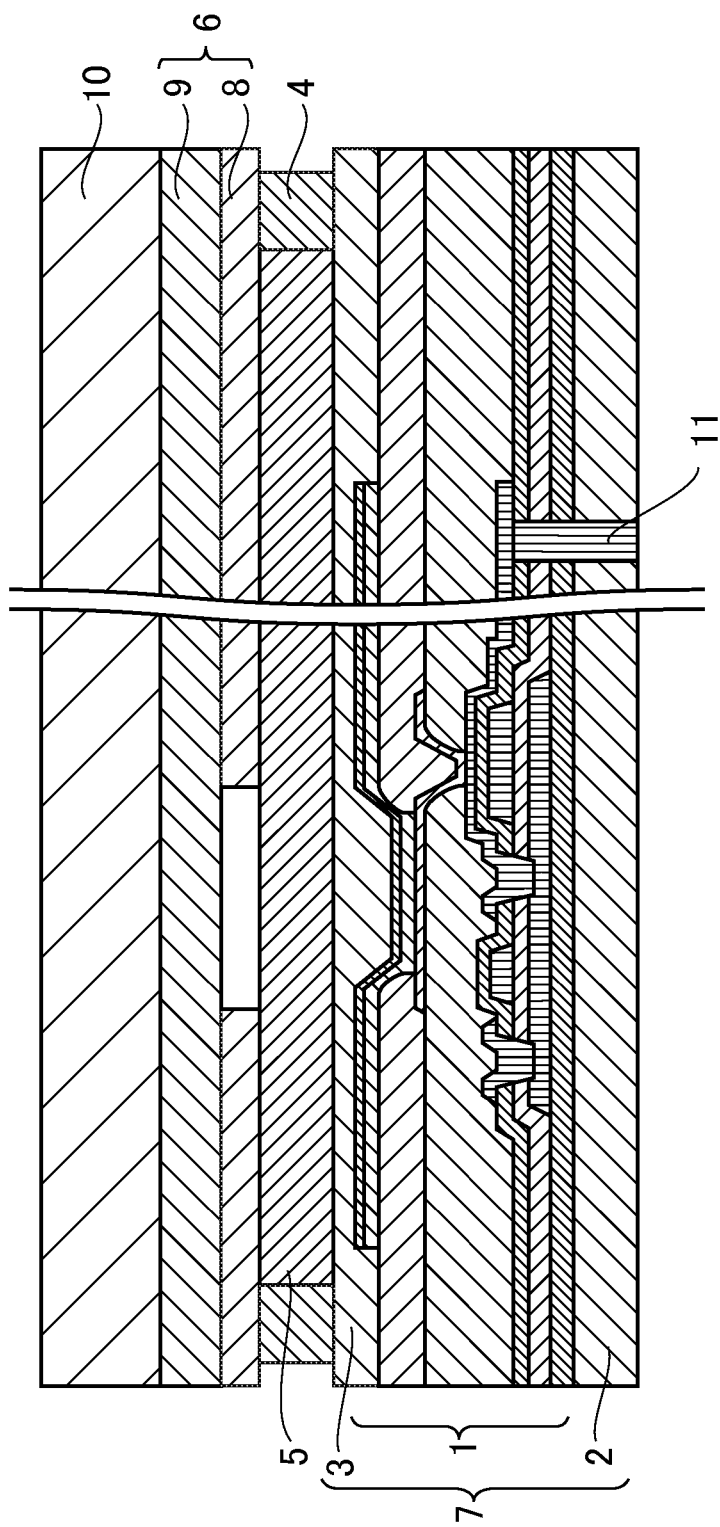
FIG. 3 is a cross-sectional diagram for explaining a manufacturing process of the display device related to the first embodiment of the present invention.

As is shown in FIG. 3, a contact hole is formed from the substrate 2 side using an existing method such as photolithography. The contact hole is formed so as to reach at least one part of a wiring which is connected to a plurality of thin film transistors included in the TFT drive circuit layer. Next, a conductive paste or plating etc. is filled into the contact hole and a through electrode 11 is formed connected to the wiring connected with the thin film transistor.

Figure 4:
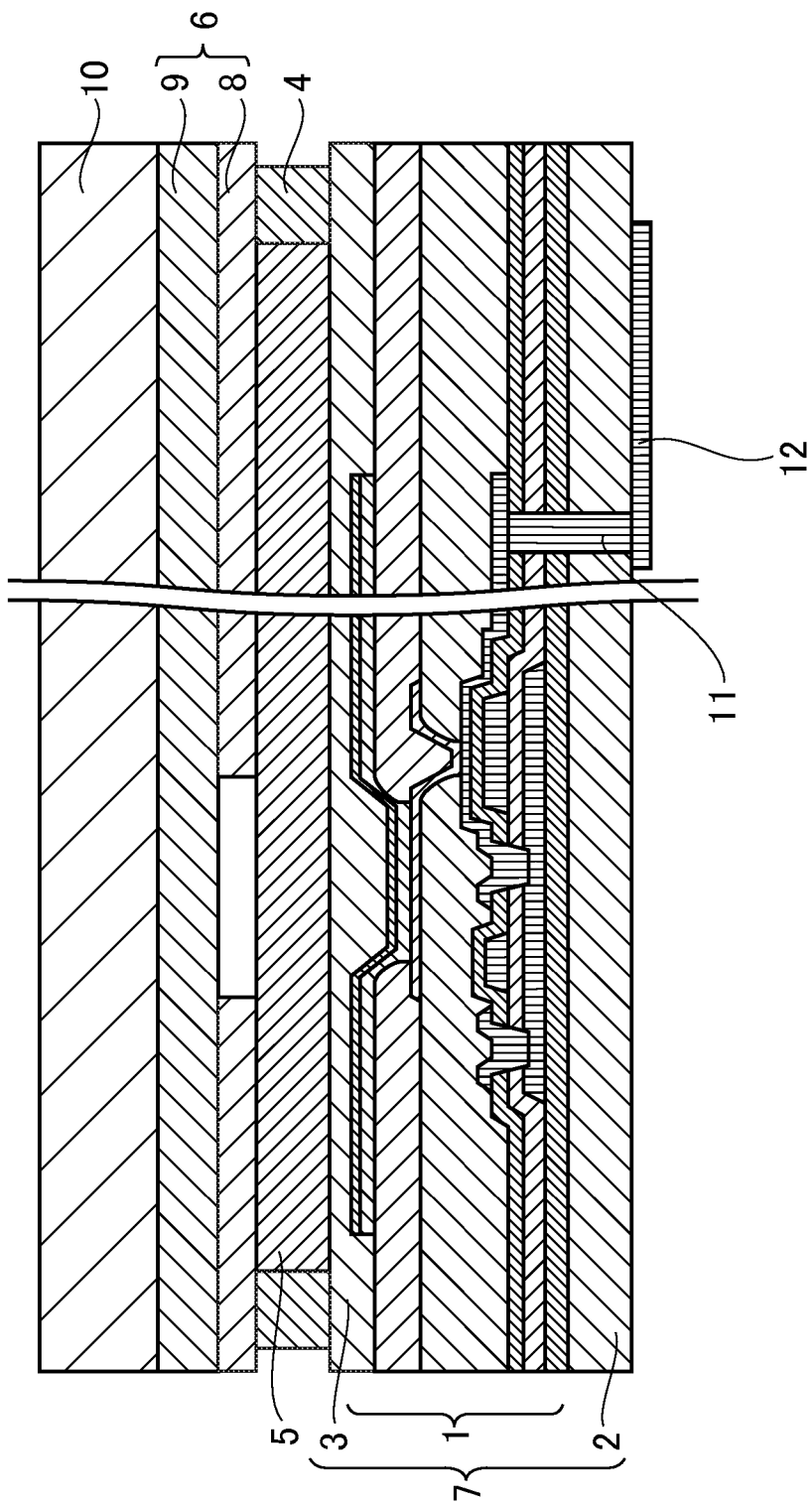
FIG. 4 is a cross-sectional diagram for explaining a manufacturing process of the display device related to the first embodiment of the present invention.

Next, as is shown in FIG. 4, wiring 12 which is connected with the through electrode 11 above the substrate 2 is formed using a patterning method such as photolithography. The wiring 12 may be formed using a metal material such as aluminum, copper or silver etc. Furthermore, a plurality of wires 12 is actually formed above the substrate 2.

Figure 5A:
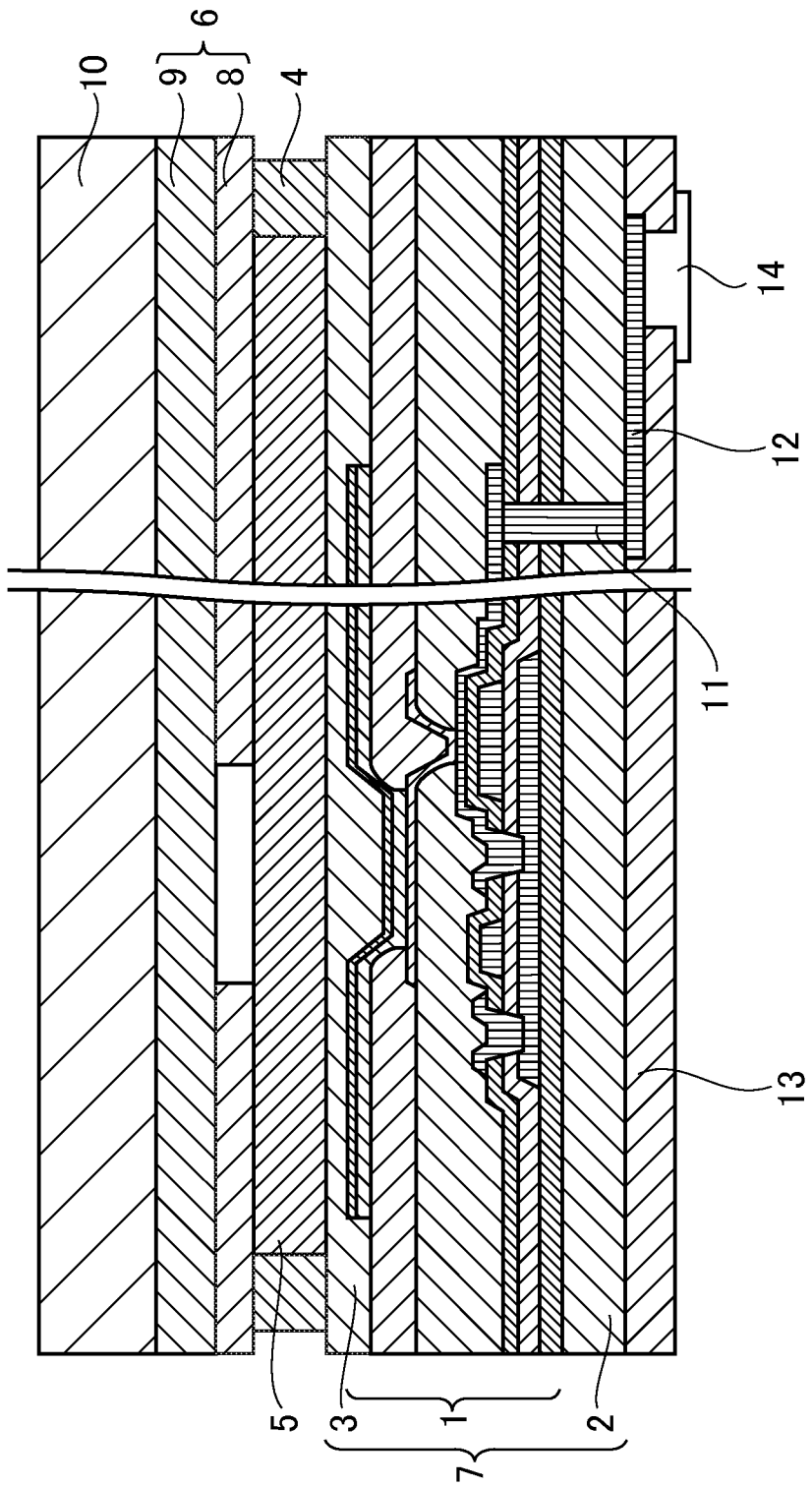
FIG. 5A is a cross-sectional diagram for explaining a manufacturing process of the display device related to the first embodiment of the present invention.

Next as is shown in FIG. 5A, an insulation film 13 is formed above the substrate 2 formed with the wiring 12. The insulation film 13 is formed using a stacked inorganic film such as silicon nitride and silicon oxide. Although one insulation film 13 is shown in FIG. 5A, as long as it is possible to realize the flexible display device 100, the insulation film may be comprised from two films of three films and is not limited to the structure shown in the diagram. In this way, by forming the insulation film 13 which covers the plurality of wires 12 over the entire surface of the substrate 2, it is possible to control water from entering into the substrate 2 comprised from a resin and insulate the plurality of wires 12 from a terminal 14 described below.

Next, as is shown in FIG. 5A, after forming the contact hole which reaches at least one part of the plurality of wires 12 using an existing method such as photolithography, a plurality of terminals 14 is formed connected to the plurality of wires 12 via the contact hole. At this time, the contact hole formed in the insulation film 13 is formed in a position separated from the position of the contact hole formed with the through electrode 11. Specifically, the contact hole formed with the through electrode 11 and the contact hole formed in the insulation film 13 are arranged apart in a position so they do not overlap each other in the stacked direction of the first substrate 7 and insulation film 13 (that is, in the direction of the insulation film 13 in a planar view). In this way, because the positions of the contact holes which can become a path for water to enter are no longer linked, it is possible to obtain a structure in which it is difficult for water to enter the interior of the display device 100.

In addition, the contact hole formed in the insulation film 13 may be arranged further on the periphery part of the first substrate 7 than the contact hole formed with the through electrode 11. In this way, an external circuit 15 (described below) connected to the terminal 14 can be arranged in the periphery part of the first substrate 7. Therefore, for example, when mounting the external circuit 15 using a method such as thermocompression, it is possible to reduce the effects caused by heat on the display region arranged with a plurality of pixels of the first substrate 7. In addition, by arranged the contact hole formed in the insulation film in the periphery part of the first substrate 7, because it is possible to arranged a contact hole which can become a path for water to enter in a position apart from the display region, it is possible to control water from entering each pixel of the display region.

The terminal 14 is formed in the contact hole formed with the insulation film 13 using an existing method such as photolithography using a conductive film including a known metal oxide such as ITO, IZO or ZnO. In this way, by forming the terminal 14 using a conductive film including moisture resistance such as ITO, IZO or ZnO, it is possible to prevent corrosion of the terminal 14 which is connected with a terminal of the external circuit 15.

Figure 5B:
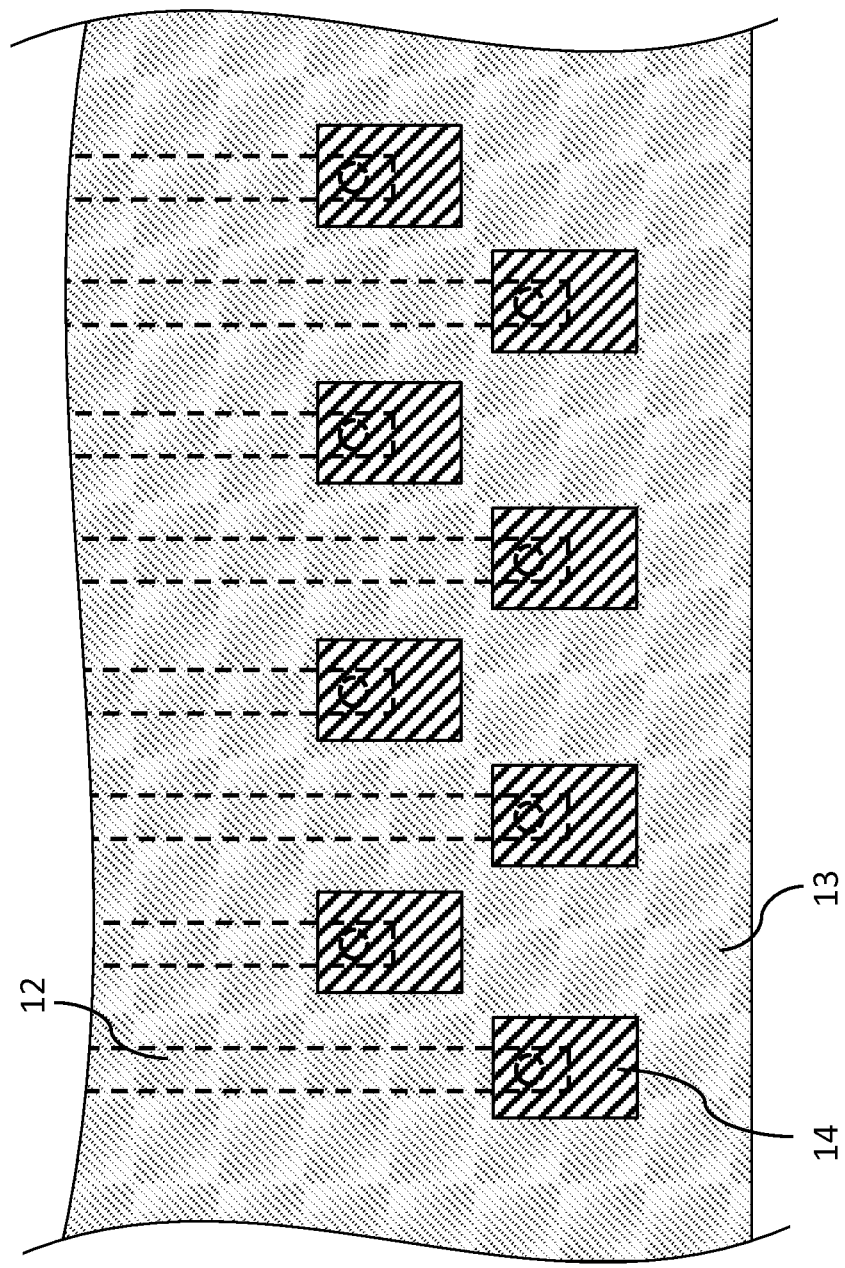
FIG. 5B is a planar view diagram showing the structure of a terminal of the display device related to the first embodiment of the present invention.

Here, as is shown in FIG. 5B, adjacent pairs of the plurality of terminals 14 may be arranged mutually different. By arranging a plurality of terminals 14 in this way, it is possible to insulate a plurality of terminals 14 from each other with a sufficient distance.

After forming the terminal 14, individual display devices 100 are separately cut by performing a separation process. The structure in which the first substrate 7 and second substrate 6 are bonded may be separated by cutting the region of each display device 100 using irradiation of laser light.

Figure 6:
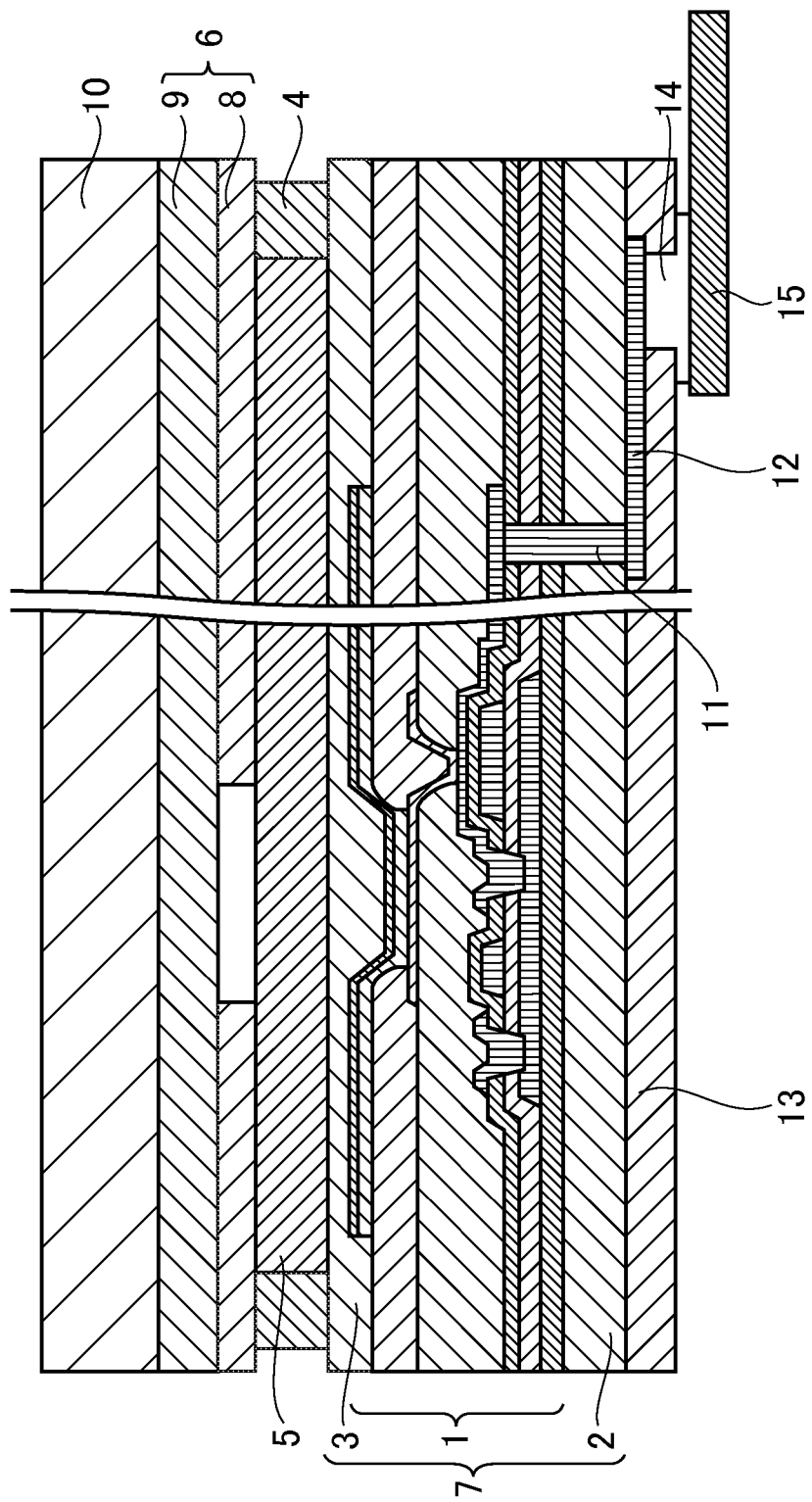
FIG. 6 is a cross-sectional diagram for explaining a manufacturing process of the display device related to the first embodiment of the present invention.

As is shown in FIG. 6, after the separation process, the terminal 14 and terminal of the external circuit 15 are respectively connected and the external circuit 15 is mounted. The external circuit 15 may be a FPC (flexible printed circuit) or driver IC etc. which supply a drive signal etc. to the thin film transistor. After the mounting process of the external circuit 15, by peeling the glass substrate 10 shown in FIG. 6 using an existing method such as irradiating laser light, it is possible to obtain the structure of the display device 100 shown in FIG. 7.

Figure 7:
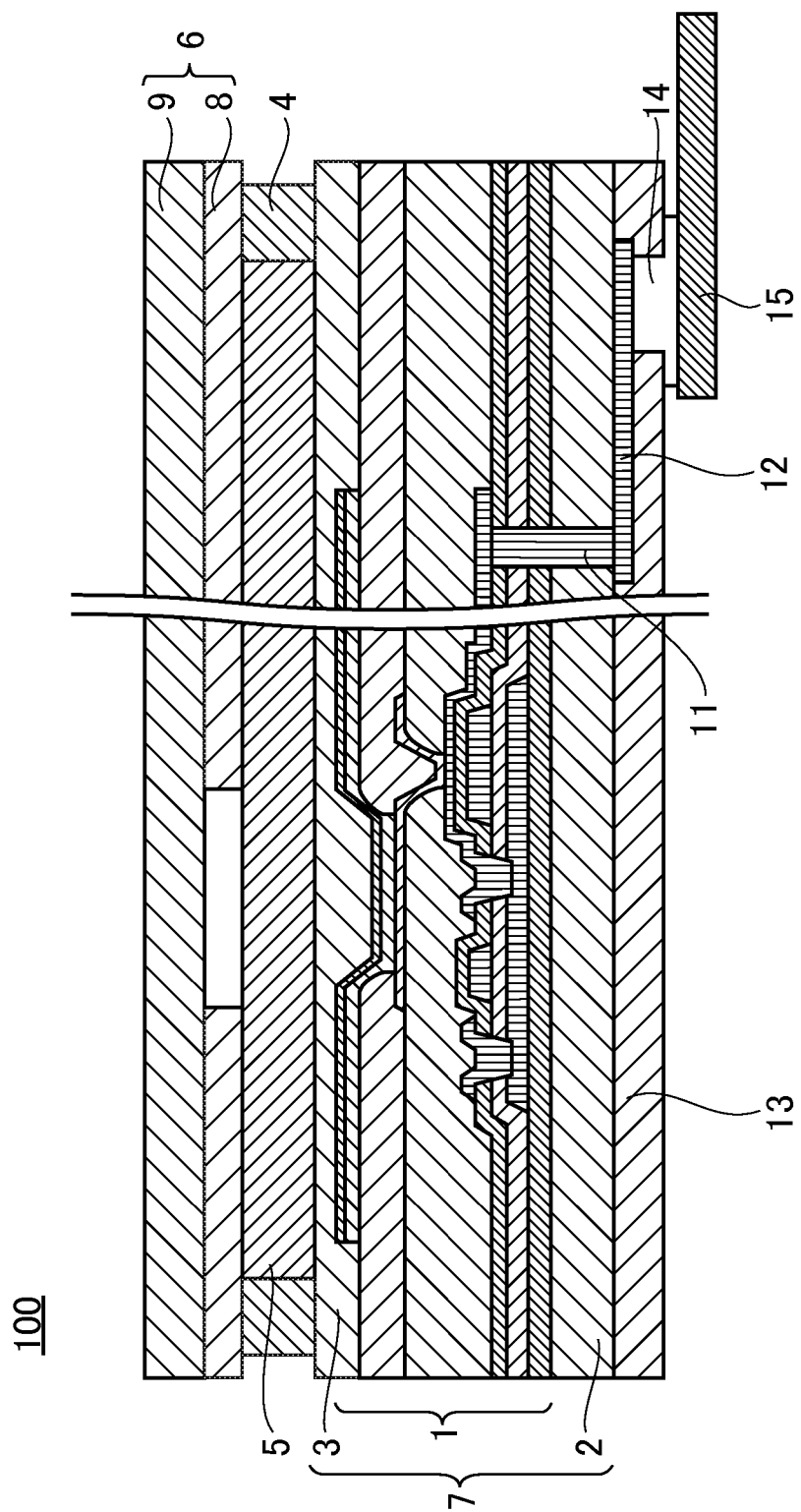
FIG. 7 is a cross-sectional diagram for explaining a manufacturing process of the display device related to the first embodiment of the present invention.

In this way, because the display device 100 shown in FIG. 7 is arranged with a structure in which light is irradiated from the second substrate 6 side including the layer 8 which includes a color filter, the external circuit 15 is arranged on the rear surface of the first substrate 7 on the opposite side of the display screen side. By arranging this type of structure, it is possible to make the surface of the second substrate 6 which forms a display screen flat.

Here, as is shown in FIG. 10 to FIG. 13, a display device 200 is imagined with a structure in which a terminal part 38 arranged with a plurality of terminals 32 connected to an external circuit 34 is exposed by removing a part of a second substrate 26. In this case, because it is necessary to remove the second substrate 26 above the terminal part 38, a step is formed in the part where the second substrate 26 is removed.

However, according to the present embodiment, because it is possible to form a flat surface of the second substrate 6 which forms a display screen without a step, it is possible to widen a display region as much as possible according to the size of the second substrate 6. Therefore, according to the present embodiment it is possible to increase the level of freedom when incorporating the display device 100 into an electronic product, and it is possible to realize a narrow frame of the display device 100.

Figure 10:
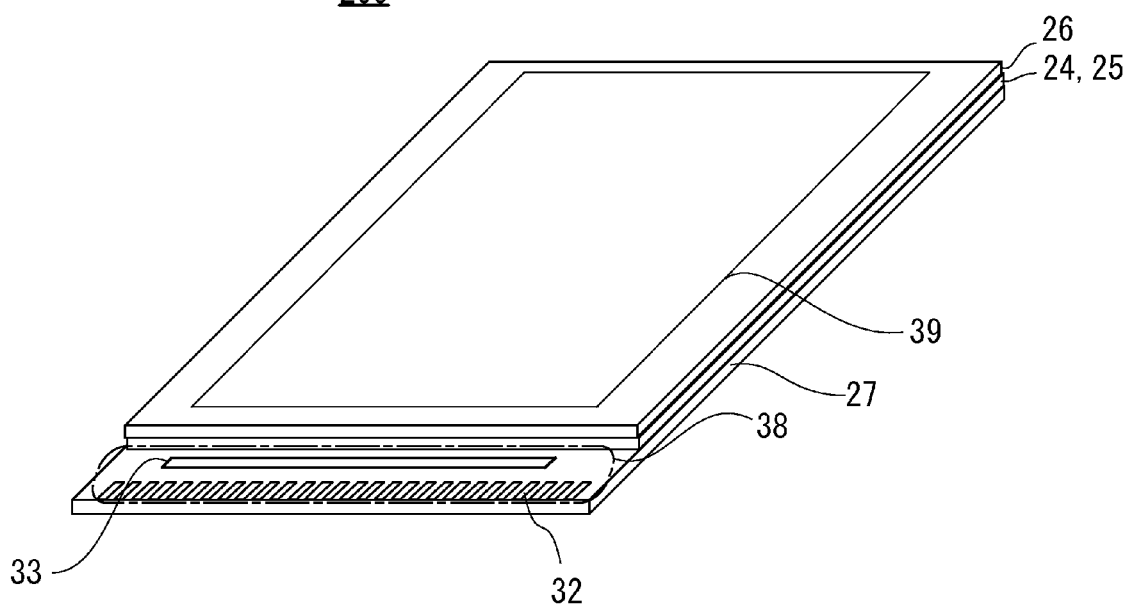
FIG. 10 is a perspective view diagrams showing an approximate structure of another display device.
Figure 11:
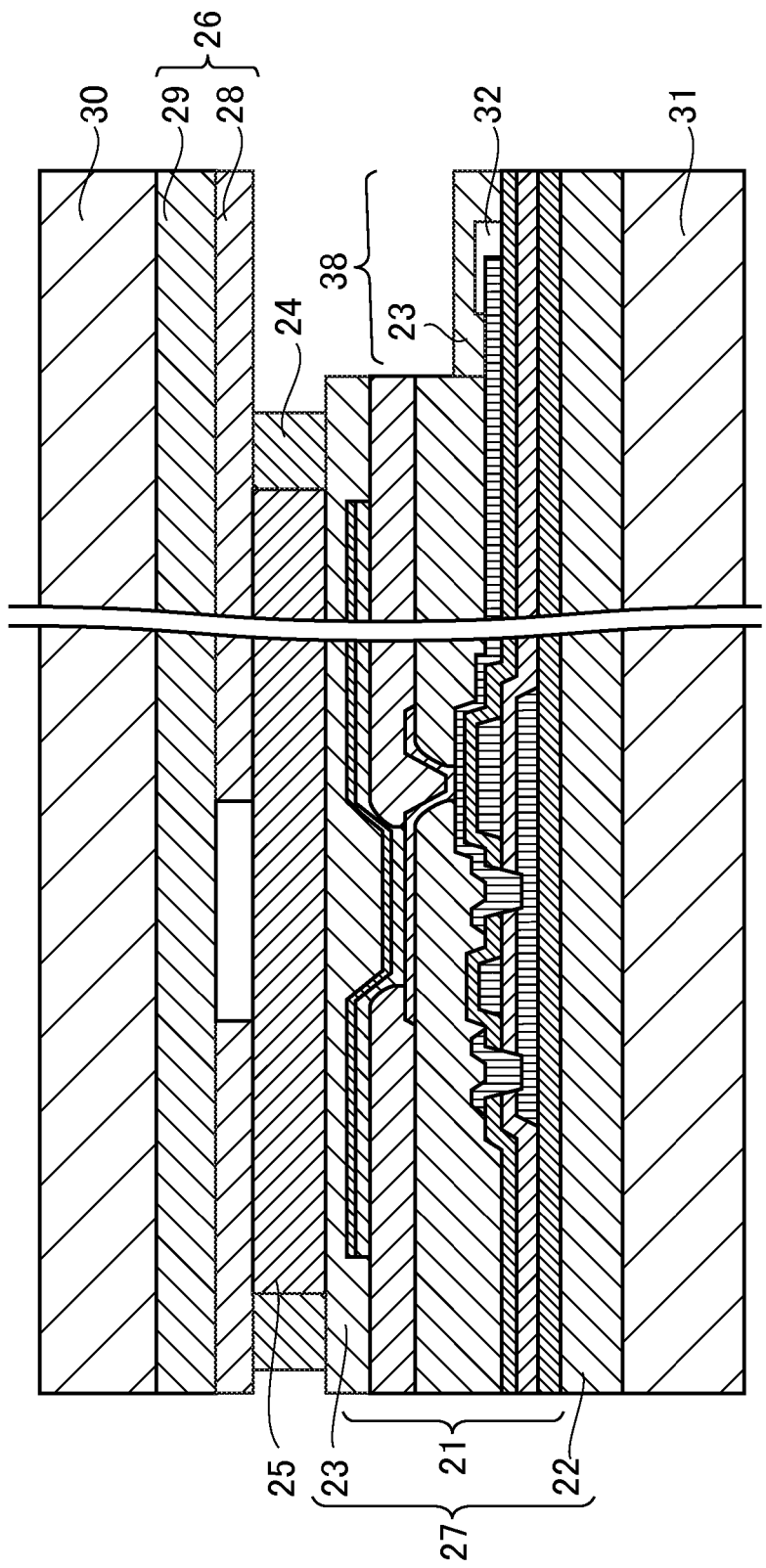
FIG. 11 is a cross-sectional diagram for explaining a manufacturing process of another display device.
Figure 12:
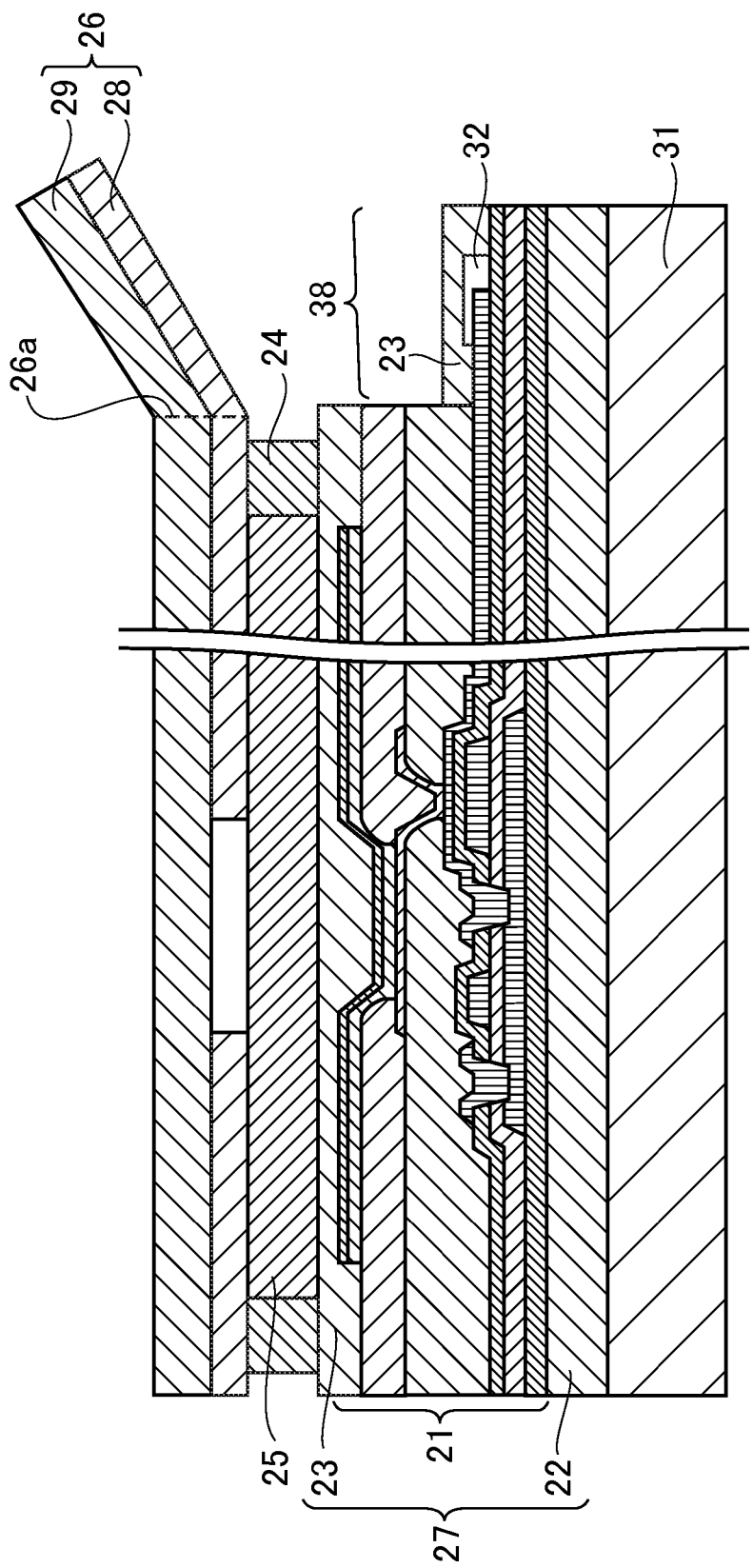
FIG. 12 is a cross-sectional diagram for explaining a manufacturing process of another display device.
Figure 13:
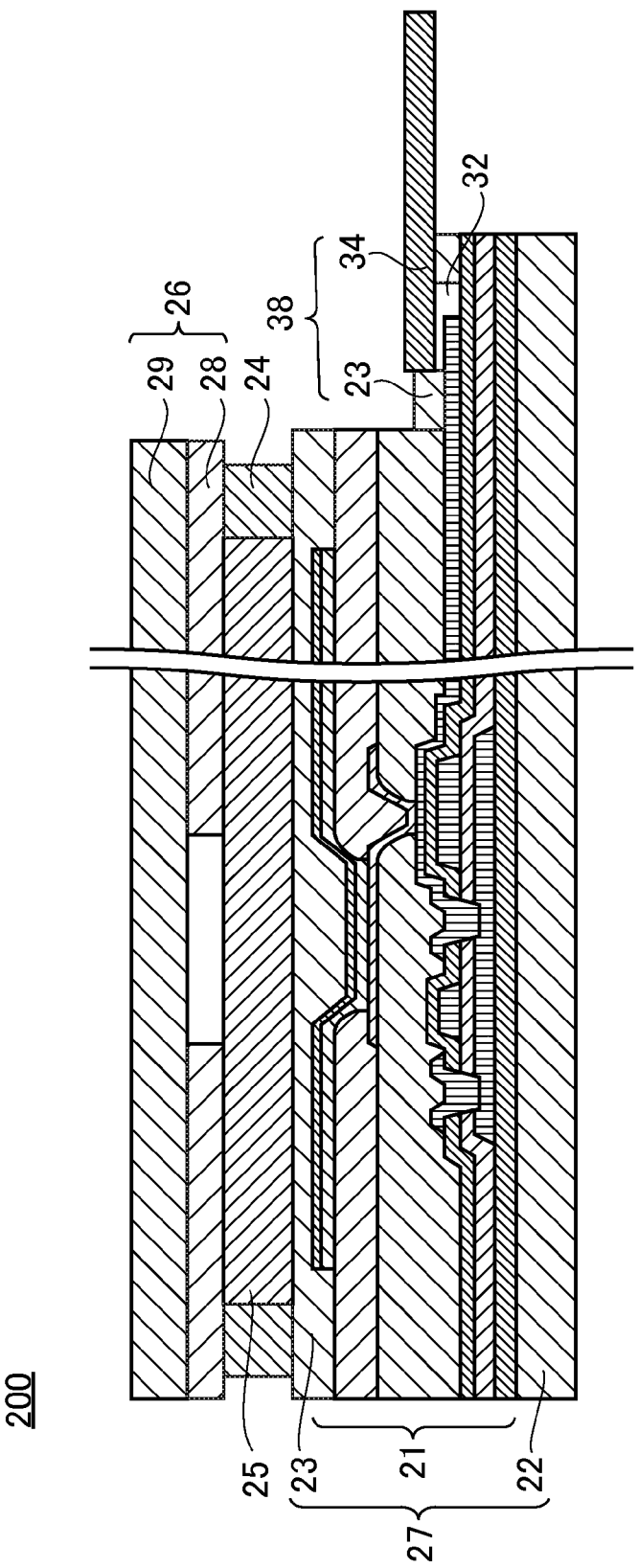
FIG. 13 is a cross-sectional diagram an approximate structure of another display device.

FIG. 10 to FIG. 13 are referred to again. In FIG. 10 to FIG. 13, unlike the display device 100 related to the present embodiment, a structure and manufacturing process of the display device 200 arranged with the terminal part 38 exposed from the second substrate 26 is are shown. The display device 200 is arranged with resin layers 22, 29 comprised from a resin such as polyimide on the first substrate 27 and second substrate 26 respectively. As is shown in FIG. 12, in the manufacturing process of the display device 200, in order to expose the plurality of terminals 32 connected with the external circuit 34 in the terminal part 38, it was necessary to cut the second substrate above the terminal part 38 at the position shown by the dotted line 26a. At this time, for example, when cutting by irradiating laser light, because the first substrate 27 is also cut, cutting using a method such as scribe break is generally used. However, according to the scribe break method, a resin layer 29 included in the second substrate 26 often remains in a round shape above the terminal part 38 without being completely cut. In this way, when the second substrate 26 remains without being cut, there is a danger that this will become an obstruction when mounting the external circuit 34.

However, according to the present embodiment, because it is not necessary to remove the second substrate 26 above the terminal part 38 in the places where the external circuit 15 is mounted as in the display device 200 shown in FIG. 10 to FIG. 13, there is no danger of the resin layer 29 remaining above the terminal part 38. Therefore, according to the present embodiment, it is possible to mount the external circuit 15 without badly affecting mounting yield. That is, it is possible to prevent the occurrence of mounting defects when mounting the external circuit 15 and secure reliability of the display device 100.

In addition, according to the present embodiment, insulation is secured by covering the wiring 12 using the insulation film 13 which includes an inorganic film such as silicon nitride, and it is possible to obtain a structure in which a terminal 14 is formed using a conductive film which is strong to corrosion such as ITO within the contact hole formed in the insulation film 13. In this structure, by closing the contact hole of the insulation film 13 using the terminal 14, it is possible to control moisture from entering the interior of the display device 100 and prevent the occurrence of corrosion in places which are connected with the external circuit 15.

In order to realize the flexible display device 100, in the case of forming a contact hold in the second substrate using a resin with high moisture permeability such as polyimide in the first substrate 7 and second substrate 6, there is a danger that moisture may easily enter the interior of the display device 100 from the contact hole. However, as in the present embodiment, by forming the insulation film 13 to cover the wiring 12 on the entire surface of the substrate 2, it is possible to control water from entering the substrate 2. Furthermore, it is possible to prevent water from entering the interior of the display device 100 by arranging the position of the contact hole formed in the substrate 2 and the position of the contact hold formed in the insulation film 13 mutually apart, and it is possible to prevent the occurrence of corrosion in the places which are connected with the external circuit 15. Therefore, according to the present embodiment, it is possible to provide a display device 100 which can secure a high level of reliability without water entering the interior of the display device 100 from parts where the external circuit 15 is mounted.

Second Embodiment

Figure 8:
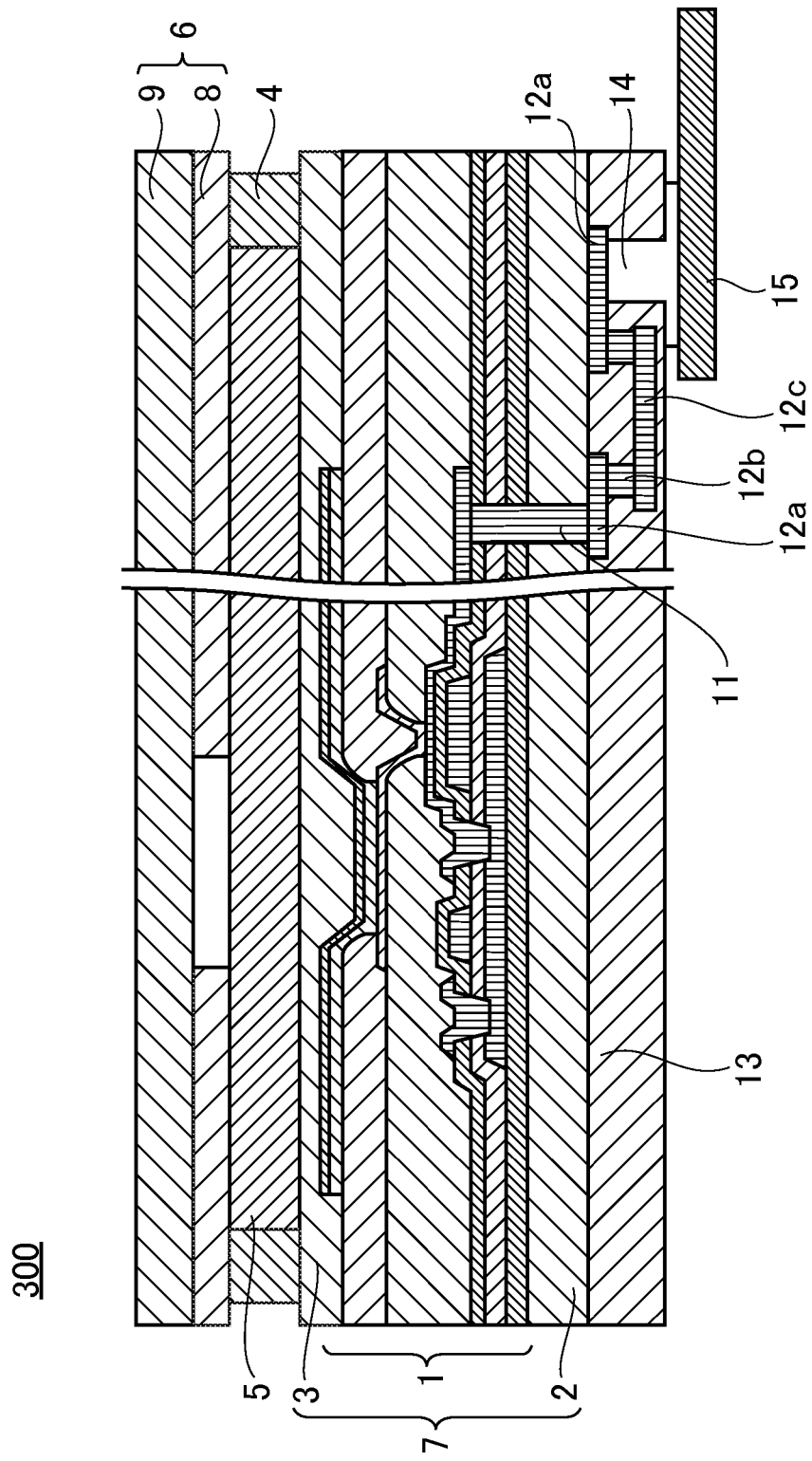
FIG. 8 is a cross-sectional diagram for explaining an approximate structure of a display device related to a second embodiment of the present invention.

Next, a display device 300 related to the second embodiment of the present invention is explained while referring to FIG. 8. FIG. 8 is a cross-sectional diagram for explaining an approximate structure of the display device 300 related to the second embodiment of the present invention.

Furthermore, the display device 300 related to the second embodiment of the present invention is different to the display device 100 related to the first embodiment of the present invention in that the wiring 12 formed above the substrate 2 is not formed from one layer but formed from two layers 12a, 12c by increasing the number of formation processes of the insulation film 13 and the number of photolithography processes. Therefore, the same reference symbols are attached to the same structure as the structure described above shown in FIG. 2 to FIG. 7 and a detailed explanation is omitted below.

As is shown in FIG. 8, although the display device 300 related to the second embodiment of the present invention is arranged with a structure in which two wiring layers 12a, 12c are arranged above the substrate 2, the present embodiment is not limited to two layers, a plurality of layers of three of more may also be arranged. Although not shown in detail in FIG. 8, a plurality of layers is formed since the insulation film 13 is mutually insulated by different wiring layers 12a, 12c. The plurality of wiring layers 12a, 12c are connected via a through electrode 12b formed in the insulation film 13.

In this way, according to the present embodiment, a structure is arranged in which the insulation film 13 and wiring 12a, 12c which are formed by a plurality of layers are formed on the rear side of the first substrate 7. As a result, it is possible to arrange the insulation film 13 which is formed from a plurality of layers between the through electrode 11 which is connected to a TFT drive circuit layer and the terminal 14 which is connected to the external circuit 15. Therefore, according to the display device 300 related to the second embodiment of the present invention, it is possible to prevent water from entering the interior of the display device 300 from parts on which the external circuit is mounted by using the insulation film 13 formed using a plurality of layers and exhibit the effect of preventing corrosion.

Third Embodiment

Figure 9:
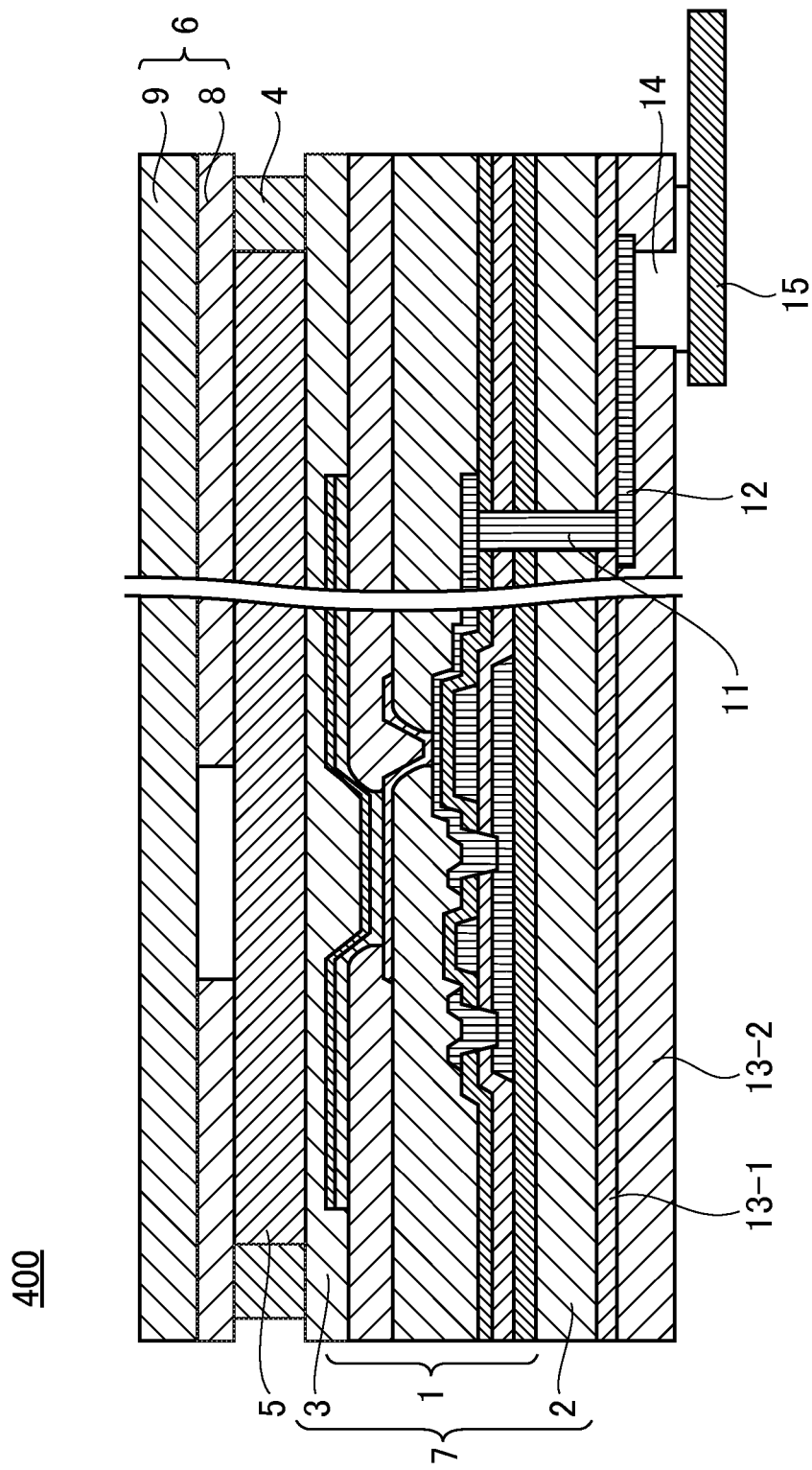
FIG. 9 is a cross-sectional diagram for explaining an approximate structure of a display device related to a third embodiment of the present invention.

Next, a display device 400 related to the third embodiment of the present invention is explained while referring to FIG. 9.

FIG. 9 is a cross-sectional diagram for explaining an approximate structure of the display device 400 related to the third embodiment of the present invention.

Furthermore, the display device 400 related to the third embodiment of the present invention is different to the display device 100 related to the first embodiment of the present invention in that after forming a first insulation film 13-1 which covers the entire surface of the first substrate 7 (substrate 2), the through electrode 11 connected to the TFT drive circuit layer is formed. Therefore, the same reference symbols are attached to the same structure as the structure described above shown in FIG. 2 to FIG. 7 and a detailed explanation is omitted below.

As is shown in FIG. 9, in the display device 400 related to the third embodiment of the present invention, a first insulation film 13-1 which covers the entire surface of the substrate 2 in the rear surface of the substrate 2 which becomes the opposite side to the display screen side. Following this, the through electrode 11 is formed which passes through the substrate 2 and first insulation film 13-1 and is connected to the TFT drive circuit layer.

Furthermore, after the wiring 12 which is connected with the through electrode 11 is formed, a second insulation film 13-2 which covers the first insulation film 13-1 and wiring 12 is formed. Here, the second insulation film 13-2 corresponds to the insulation film 13 of the display device 100 related to the first embodiment of the present invention. In addition, the first insulation film 13-1 and second insulation film 13-2 may be formed using the same material as the insulation film 13.

In this way, after covering the entire rear surface of the second substrate 2 comprised from a resin with high moisture permeability using the first insulation film 13-1 which includes an inorganic film such as silicon nitride, the entire rear surface of the first insulation film 13-1 formed with the wiring 12 is covered using the second insulation film 13-2. In this way, it is possible to control water from entering the substrate 2 and control water from entering the interior of the display device 100 from the contact hole formed in the substrate 2 and the first insulation film 13-1. Therefore, according to the display device 400 related to the third embodiment of the present invention, it is possible to prevent water from entering the interior of the display device 400 and prevent the occurrence of corrosion in the places connected with the external circuit 15.

As described above, according to the display devices related to the first to third embodiments of the present invention, it is possible to prevent water from entering the interior of a display device from parts on which an external circuit is mounted and provide a display device which can secure a high level of reliability. In addition, it is possible to provide a display device which can be mounted with an external circuit without adversely affecting mounting yield.

What is claimed is:
1. A display device comprising:
   a first substrate arranged with a plurality of pixels on a first surface, the plurality of pixels having a display element including a transistor, and a first wiring connected to the transistor;
   a through electrode arranged in a first contact hole reaching the first wiring from a second surface which is an opposite side surface of the first surface of the first substrate;
   a second wiring connected with the through electrode;
   a first inorganic insulation film arranged covering the second wiring on the second surface of the first substrate: and a terminal connected with the second wiring in a second contact hole arranged in the first inorganic insulation film, wherein a second insulation film is arranged on the second surface of the first substrate, and the first contact hole reaches the first wiring passing through the second insulation film.

2. The display device according to claim 1, wherein the first contact hole and the second contact hole are mutually arranged apart in plain view.

3. The display device according to claim 1, wherein the second contact hole is arranged further to the periphery edge part of the first substrate than the first contact hole.

4. The display device according to claim 1, wherein the first inorganic insulation film includes silicon nitride or silicon oxide.

5. The display device according to claim 1, wherein the second insulation film includes silicon nitride or silicon oxide.

6. The display device according to claim 1, wherein the first substrate includes a resin.

7. The display device according to claim 6, wherein the resin includes polyimide.

8. The display device according to claim 1, wherein a second substrate is arranged facing the first substrate with the first surface of the first substrate sandwiched therebetween.

9. The display device according to claim 1, wherein the terminal is connected with a flexible printed circuit substrate.

10. The display device according to claim 1, wherein a driver IC is connected to the terminal.

11. The display device according to claim 1, wherein the terminal is formed from a conducive film including a metal oxide.

* * * * *